United States Patent [19]

Nagura

[11] Patent Number: 5,792,673
[45] Date of Patent: Aug. 11, 1998

[54] MONITORING OF ECHING

[75] Inventor: Masahiko Nagura, Hamamatsu, Japan

[73] Assignee: Yamaha Corporation, Japan

[21] Appl. No.: 593,008

[22] Filed: Jan. 29, 1996

[30] Foreign Application Priority Data

Jan. 31, 1995 [JP] Japan ................................. 7-034343

[51] Int. Cl.⁶ ................................................ H01L 21/205
[52] U.S. Cl. ........................ 438/7; 438/8; 438/9; 438/16; 438/694; 438/697
[58] Field of Search ........................... 438/7, 8, 9, 16, 438/694, 697

[56] References Cited

U.S. PATENT DOCUMENTS 4,863,548  9/1989  Lee ............................................. 438/7

FOREIGN PATENT DOCUMENTS

| 54-53864 | 4/1979 | Japan . |
|---|---|---|
| 58-180027 | 10/1983 | Japan . |
| 1-105533 | 4/1989 | Japan . |
| 2-207545 | 8/1990 | Japan . |
| 2-208951 | 8/1990 | Japan . |
| 2-307266 | 12/1990 | Japan . |
| 2-310942 | 12/1990 | Japan . |
| 5-299410 | 11/1993 | Japan . |
| 5-87246 | 12/1993 | Japan . |
| 7-153802 | 6/1995 | Japan . |
| 7-201823 | 8/1995 | Japan . |

*Primary Examiner*—Mark Chapman

[57] ABSTRACT

On an insulating film covering a silicon substrate formed with desired circuit elements, a first Al wiring layer is formed and at the same time a test pattern is formed by using the same Al layer. The test pattern has a same thickness as the first Al wiring layer and has a shape with different line/space ratios at a plurality of positions. A coated film is formed over the wiring layer and test pattern, and etched back. During this etch-back, the border position between the coated film at the space area in the test pattern and the exposed insulating film is optically detected to judge the etching amount, in accordance with previously measured correlation data between the border position and an etching amount. Thus, discrimination can be done whether the etching amount is optimum or not. A method of manufacturing a semiconductor device is provided which can easily judge through optical non-destructive inspection whether the etching amount is optimum or not.

20 Claims, 8 Drawing Sheets

MONITORING OF ECHING

BACKGROUND OF THE INVENTION a) Field of the Invention

The present invention relates to manufacture of semiconductor devices, and more particularly to a technique of etching-back a film which is coated over a stepped surface such as a surface of a wiring layer.

b) Description of the Related Art

Technique of etching a coated film is mainly used as planarizing technique for reducing steps of multi-wiring layers of a semiconductor integrated circuit. For example, a first wiring layer is formed on a semiconductor substrate with circuit elements formed thereon, and an interlayer insulating film is deposited over the first wiring layer. To flatten or planarize the irregular surface of the interlayer insulating film conformal to the underlying first wiring layer, a glass film made of spin-on-glass (SOG), etc. is coated and the whole surface thereof is etched back through dry etching. The glass film may be completely removed from flat and wide surfaces, and may remain only near stepped portions. In such a case, the thickness of a glass film left after etching decreases gradually from the stepped edge to decrease the original step height. On this planarized substrate surface, a second wiring layer is formed (refer, for example, to Japanese Patent Publication No.5-87146).

It is necessary for such planarizing techniques to optimize an etching amount of a coated film. There are several methods of controlling an etching amount, which include:

(a) a method of determining an etching amount of a coated film from an etching time, by previously measuring an etching rate;

(b) a method of etching a coated film in plasma and estimating a thickness of a coated film left unetched (by detecting appearance of an underlying surface at a different position), from an intensity change in radiative spectra;

(c) a method of optically measuring a thickness of a coated film left unetched at a flat area by ellipsomery or by other means.

Both the methods (a) and (b) use indirect film thickness measurement so that highly precise control of an etching amount may be difficult. With the method (c), although the thickness of a coated film left unetched at the flat area can be measured, this method (c) cannot be used if etching is performed more than the thickness of the coated film at the flat area. For example, when a coated film is to be removed completely from flat areas and to be left only at stepped areas, it is difficult to employ this method.

There is another method of measuring an etching amount of a coated film by inspecting the cross section of a semiconductor substrate with an electron microscope or other apparatuses after the film is etched back. This inspection after etching-back is a destructive inspection and has a delay in feeding the inspection results back to actual processes. It is also difficult to have a number of observation points in a single chip.

SUMMARY OF THE INVENTION

It is an object of the present invention to provide a method of manufacturing a semiconductor device capable of judging an optimum etching amount through simple non-destructive optical inspection.

According to one aspect of the present invention, there is provided a method of manufacturing a semiconductor device comprising the steps of: forming a test pattern on a surface of a semiconductor substrate formed with desired circuit elements, the test pattern having line and space areas having different ratios of a line width to a space width at a plurality of positions on the substrate, and the line area having a constant thickness; forming a coated film over the surface of the semiconductor substrate formed with the test pattern; and etching-back the coated film, while detecting a border position between the coated film at the space area in the test pattern and an exposed underlying layer and estimating etching amount from previously measured correlation data between the border position and an etching amount.

According to another aspect of the present invention, there is provided a method of manufacturing a semiconductor device comprising the steps of: forming a test pattern on a surface of a semiconductor substrate formed with desired circuit elements, the test pattern having line areas and space areas having different ratios of a line width to a space width at a plurality of positions on the substrate, and the line areas having a constant thickness; forming an insulating film over the surface of the semiconductor substrate formed with the test pattern; forming a coated film on the insulating film; and etching-back the coated film, while detecting a border position between the coated film at the space area in the test pattern and an exposed insulating film and judging from previously measured correlation data between the border position and an etching amount, whether the etching amount is optimum or not.

After a coated film is etched off on a flat and wide area apart from any rising steps, it remains with varying thickness at a gap portion and near a rising step. To judge whether an etching amount of a coated film is optimum or not, a convex test pattern is used having line areas and space areas having different ratios of a line width to a space width (hereinafter simply called line/space ratios) at a plurality of positions on the substrate, the line areas having a constant thickness on an underlying surface. Such a test pattern is formed on a flat surface and a coated film is formed thereon and etched back. The etching amount of the coated film becomes different at areas with different line/space ratios, and the border position between the coated film and its exposed underlying layer changes with the etching amount. The border position between the coated film and the underlying layer can be easily detected with an optical microscope.

Correlation data between the etching amount and the border position of the coated film and underlying layer in the test pattern, is obtained in advance through a plurality of repetitive measurements. During an actual planarizing process, the border position is optically detected and the optimum etching amount is judged in accordance with the correlation data.

Destructive inspection is not necessary and multipoint inspection is easy. Planarization can be performed under a correct etching amount control and with less variation.

The above and other objects, features, and advantages of the present invention will become apparent from the following detailed description of embodiments when read in conjunction with the accompanying drawings.

DETAILED DESCRIPTION OF THE PREFERRED EMBODIMENTS

Embodiments of the invention will be described with reference to the accompanying drawings.

Figure 1A:
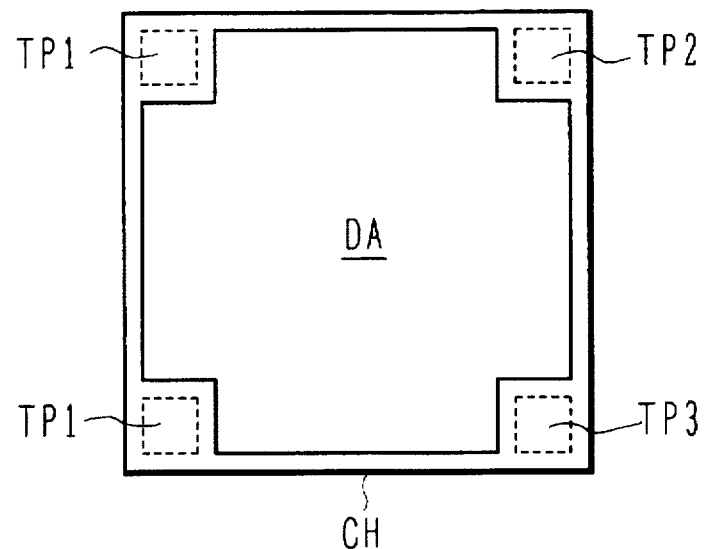
FIGS. 1A to 1I illustrate main steps of a process of manufacturing a semiconductor device provided with a test pattern according to an embodiment of the invention.

FIGS. 1A to 1I illustrate a test pattern formed on a semiconductor chip. FIG. 1A is a schematic top view of a semiconductor chip. The semiconductor chip CH has a device area DA at a central area of the chip. Test patterns TP1 to TP4 are formed at four corners of the chip CH. The outer sides of each test pattern TP are disposed in parallel to the corresponding sides of the chip CH.

Figure 1B:
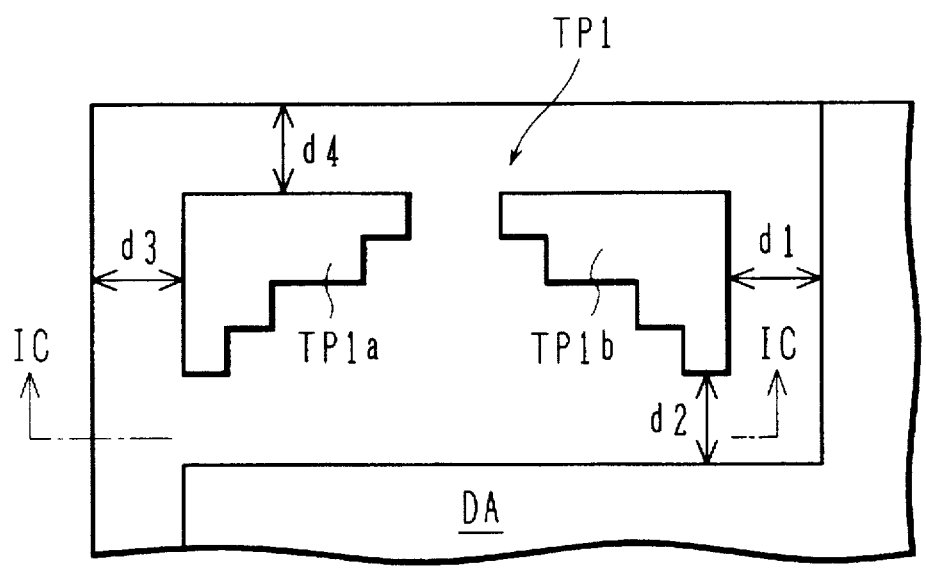

FIG. 1B is an enlarged top view of the test pattern TP1. The test pattern TP1 has a pair of opposing patterns TP1a and TP1b. The patterns TP1a and TP1b are formed spaced apart from the device area DA by distances d1 and d2. The distances d1 and d2 are preferably 10 μm or larger. Circuit elements such as semiconductor elements and wiring patterns can be formed anywhere in this device area DA. The patterns TP1a and TP1b are formed also spaced apart from the side edges of the chip CH by distances d3 and d4. The distances d3 and d4 are preferably 10 μm or larger.

The opposing patterns TP1a and TP1b define therebetween spaces having different widths as will be later described. The test pattern TP2 has a planar shape in right/left symmetry with (or same as) the test pattern TP1. The test patterns TP3 and TP4 have planar shapes in up/down symmetry with the test patterns TP2 and TP1.

Figure 1C:
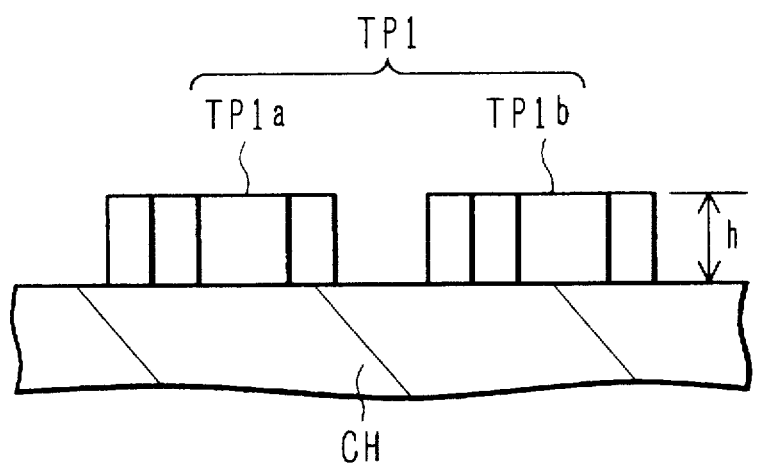

FIG. 1C is a cross section taken along line IC—IC, showing the inner side walls of the test pattern TP1. The pair of opposing patterns TP1a and TP1b of the test pattern TP1 have the same height h, and are formed on a flat surface of the chip CH. Spaces having different widths in the lateral direction in FIG. 1C and the same height are defined between the patterns TP1a and TP1b.

Figure 1D:
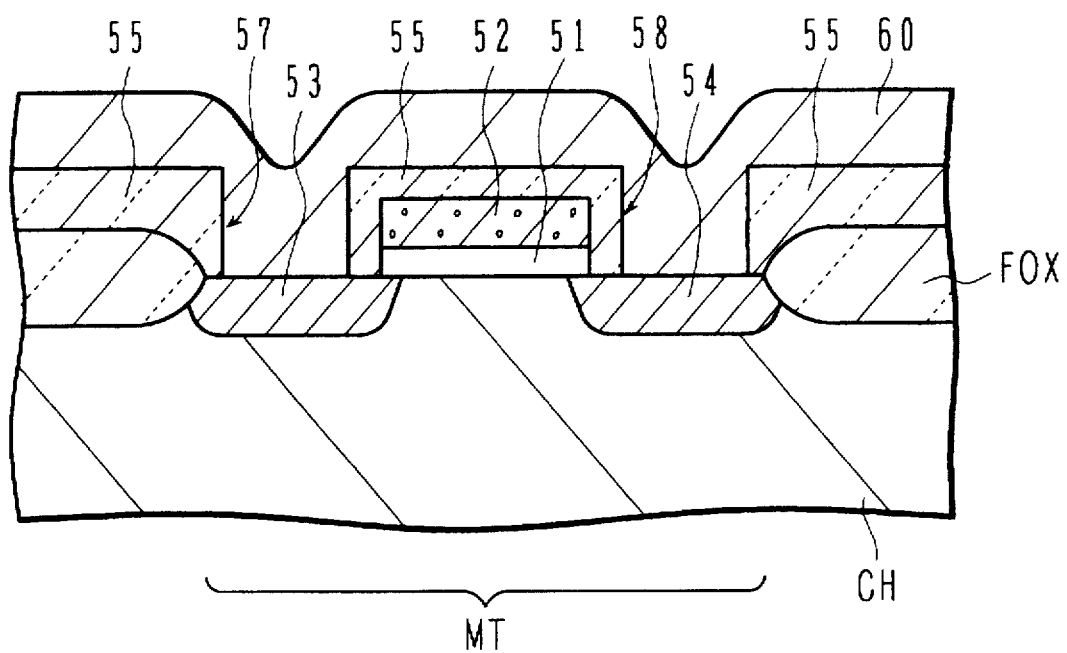

Referring to FIG. 1D, how and when the test patterns are formed will be described. A field oxide film FOX having a predetermined pattern is formed on the surface of a silicon semiconductor chip CH to define a plurality of active regions or moats MT surrounded by the field oxide film. In the active region MT, a MOS transistor structure is formed having a gate oxide film 51, a gate electrode 52, and source/drain regions 53 and 54 having the opposite conductivity type to that of the substrate CH. A first interlayer insulating film 55 is deposited over the substrate surface. Contact holes 57 and 58 exposing the source/drain regions 53 and 54 are formed in the first interlayer insulating film 55, and thereafter a first wiring layer 60 of a laminate of barrier metal (Ti, TiN, TiON, etc.) and Al or Al alloy is deposited over the first interlayer insulating film 55. At the same time when the first wiring layer 60 is patterned, test patterns TP1 to TP4 are also formed. If a multi-wiring layer is formed, the test patterns may be formed when an upper level wiring layer is formed.

Figure 1E:
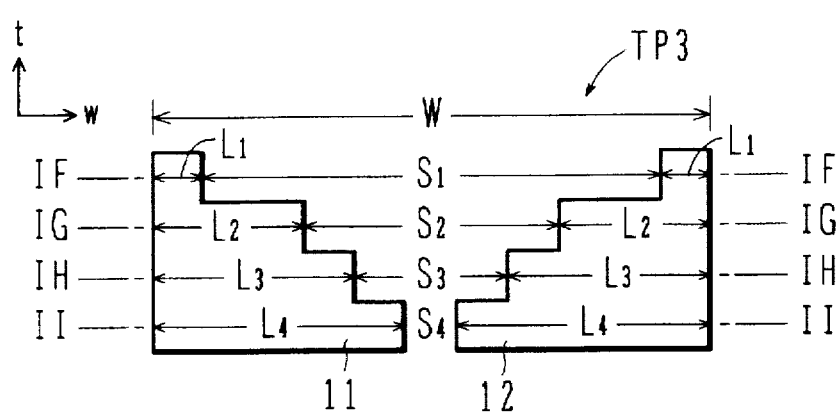

FIG. 1E is a more detailed top view of the test pattern, for example, test pattern TP3. Patterns 11 and 12 face each other to define therebetween spaces having different widths. The direction the pair of patterns facing each other in the horizontal direction in FIG. 1E is called a width direction w, and the direction perpendicular to the width direction on the chip surface, i.e. the vertical direction in FIG. 1E, is called a transverse direction t.

The pair of patterns 11 and 12 have the same height h as shown in FIG. 1C and has a planar shape shown in FIG. 1E. The right and left outer sides of the patterns 11 and 12 are directed in the transverse direction and are parallel. The right and left inner sides of the patterns 11 and 12 have a stair shape as shown in FIG. 1E. The height of each stair step (length in the transverse direction t) is the same, whereas the width thereof (length in the width direction w) is different. These inner and outer sides define pattern areas having different lengths (widths) L in the width direction w, in the patterns 11 and 12. The widths L increase, from the upper to the lower position in FIG. 1E, from L1, to L2, L3 and to L4.

The opposing inner sides of the patterns 11 and 12 define therebetween space areas having different sizes (space widths) S in the width direction w. The space widths S decrease, from the upper to the lower position in FIG. 1E, from S1, to S2, S3 and to S4. The space width S changes, for example, in a range from 1 μm to 20 μm. For example, the narrowest space S4 is 1 μm, and the widest space S1 is 20 μm. The patterns 11 and 12 are disposed in the area having a width W. Therefore, pattern (line)/space ratio along the width direction w of the patterns 11 and 12 changes as position changes along the transverse direction t.

FIGS. 1F to 1I are cross sectional views taken along lines IF—IF, IG—IG, IH—IH, and II—II shown in FIG. 1E.

Figure 1F:
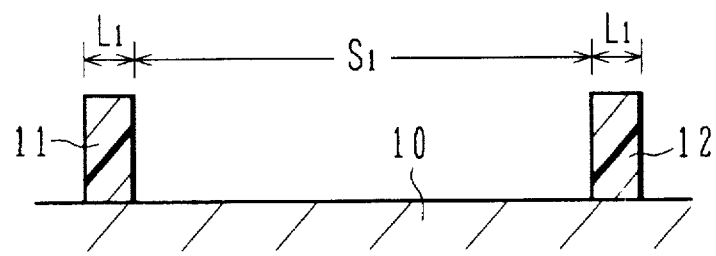
Figure 1G:
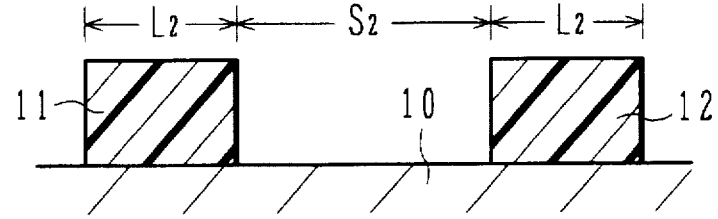
Figure 1H:
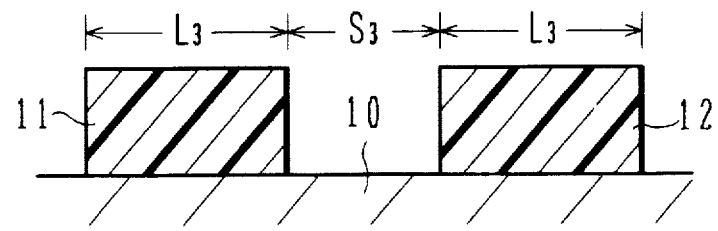
Figure 1I:
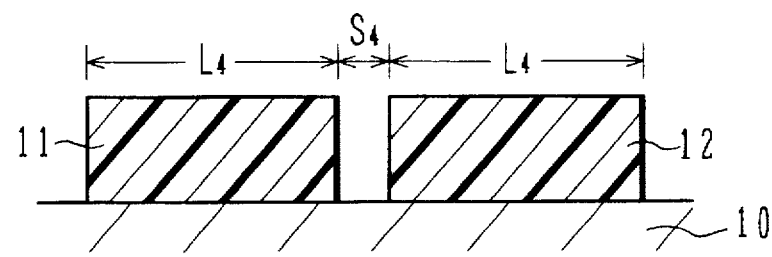
Figure 2A:
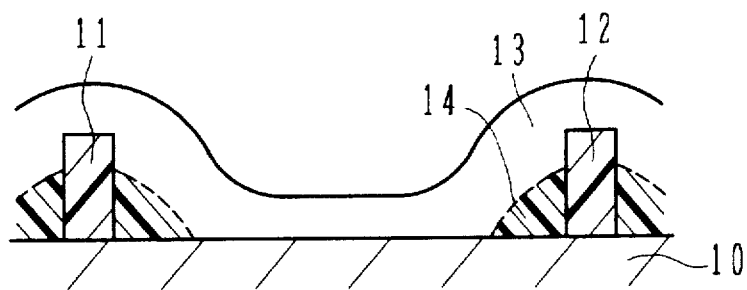
FIGS. 2A to 2D are cross sectional views illustrating the relationship between the shape (position) of a test pattern and thicknesses of a coated film left unetched.
Figure 2B:
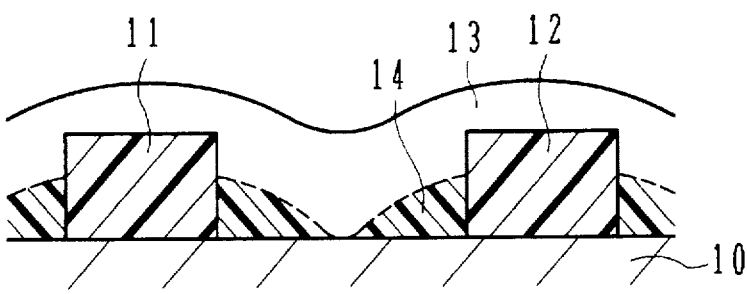
Figure 2C:
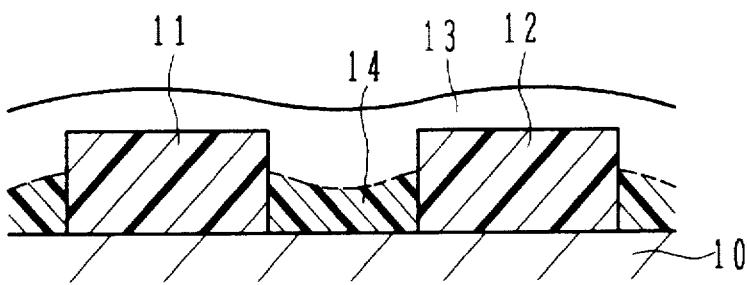
Figure 2D:
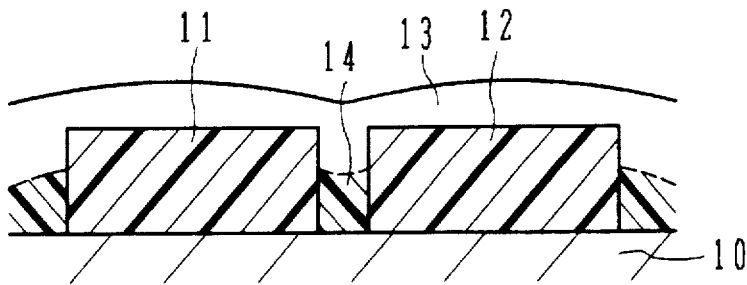

In FIG. 1F, the space width is S1 and the pattern area widths on both sides of the space area are L1. In FIG. 1G, the space width is S2 and the pattern area widths on both sides of the space area is L2. In FIG. 1H, the space width is S3 and the pattern area widths on both sides of the space area are L3. In FIG. 1I, the space width is S4 and the pattern area widths on both sides of the space area is L4.

Although it is assumed in the foregoing description that the patterns 11 and 12 are formed on a flat surface of a substrate 10, the surface of the substrate 10 is not necessarily required to be thoroughly flat, but the surface of the substrate 10 is sufficient if it has a degree of flatness sufficient for providing a function of a test pattern at a planarizing process to be described later. Similarly, the heights of the patterns 11 and 12 are not necessarily required to be just the same, and the top surfaces thereof are not necessarily required to be thoroughly flat. This is also true for parallelism between the substrate surface and the pattern top surface.

After the test patterns are formed on the flat surface of the substrate 10, a film made of such as spin-on-glass (SOG) is coated over the substrate surface by a spincoater and is etched back in plasma by dry etching. An etching amount of the coated film etched back by dry etching using plasma is different at each area having a different pattern (line)/space ratio, and the border position of the coated film and the underlying layer changes with the etching amount. The following preliminary measurements were conducted in order to investigate and establish the relationship between the etching among and the border position.

Figure 3:
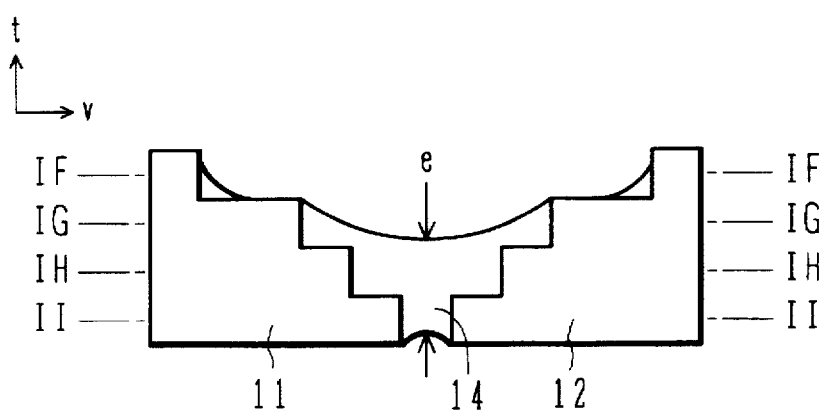
FIG. 3 is a plan view illustrating the relationship between the test pattern and the unetched coated film.
Figure 4:
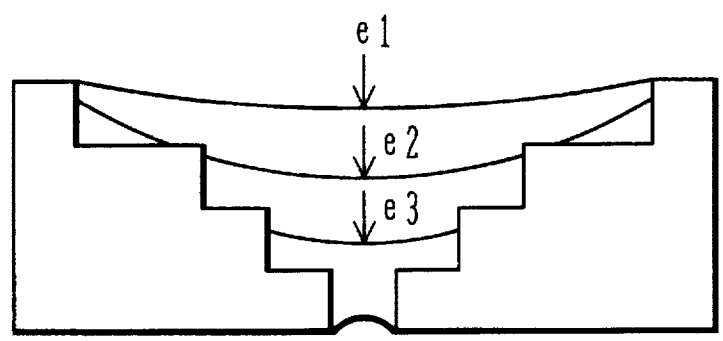
FIG. 4 is a plan view illustrating a change in the border position between a coated film left unetched and an underlying layer.

FIGS. 2A to 2D illustrate a coated film 13 made of such as SOG formed on a substrate having the test patterns such as shown in FIGS. 1E to 1I, and a coated film 14 left unetched after a predetermined time of etch-back. FIGS. 2A to 2D are cross sectional views taken along lines IF—IF, IG—IG, IH—IH, and II—II of FIG. 1E. As shown, the cross section of the coated film at the space area between test patterns and the degree of etching become different depending upon the space area width. The state of the left film 14 in the top plan view is shown in FIG. 3. The border position e between the left film 14 and the underlying layer at the center of the space area gradually moves lower in the transverse direction as the etching progresses. FIG. 4 illustrates a change in the shape of the left film as the etching progresses. The border positions shifts as e1, to e2, to e3.... as the etching progresses. This border position e on the test pattern in the transverse direction t can be observed by an optical microscope or the like.

Figure 5:
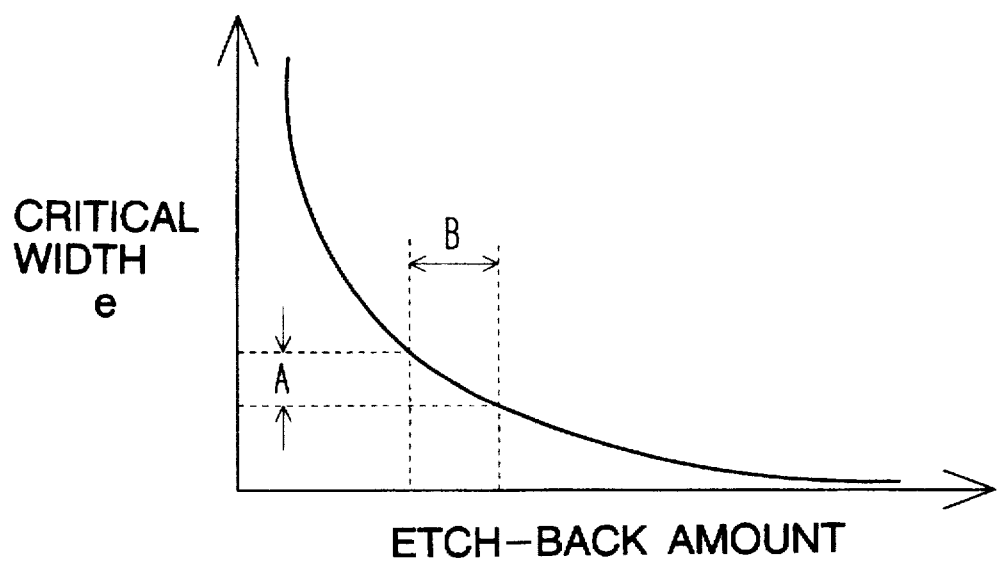
FIG. 5 is a graph showing a correlation between an etch-back amount and a critical width at the area where a coated film is left unetched.

The above-described measurement provides a relationship between the etch-back amount (i.e., an etching amount of a coated film) and the border position e, more specifically a relationship between the etch-back amount and the maximum width (critical width) in the width direction w of the space area where the film 14 is left unetched. By measuring the critical width as a function of the etch-back amount, a correlation between the etch-back amount and the critical width e can be obtained as shown in FIG. 5. If this correlation data is prepared in advance, the etch-back amount can be estimated by detecting the critical width e of the test pattern during the planarizing process. For example, if the critical width is in the range A, the etch-back amount can be judged to be in the range B.

Figure 6:
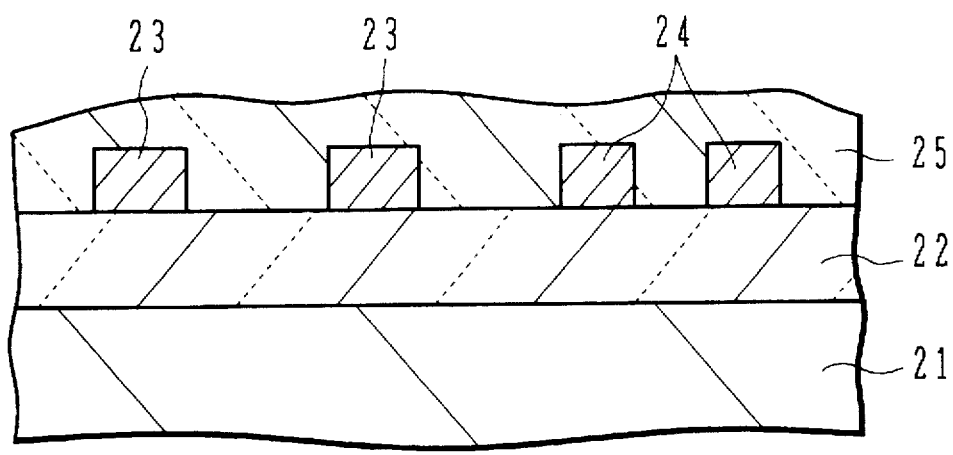
FIG. 6 illustrates a planarizing process according to the embodiment.

An embodiment will be described using this technique as the planarizing process of reducing wiring steps. As shown in FIG. 6, a first wiring pattern (a laminate of Ti and Al layers) 23 is formed on an insulating film 22 covering a silicon substrate 21 with circuit elements. At this wiring patterning process, a test pattern 24 such as shown in FIGS. 1A to 1I is also formed on the flat surface of the substrate 21. Although the drawing of FIG. 6 shows the structure in a simplified form, the test pattern 24 and wiring pattern 23 are formed separated by 10 μm or larger as described with reference to FIG. 1B. An SOG film 25 for example is coated as a planarizing film for removing or reducing steps of the first wiring pattern 23. An example of SOG coating conditions is coating at a rotation speed of 5000 to 7000 rpm, followed by baking at 180° C. Then, etch-back is performed to remove the coated film at flat and wide portions under the conditions of: oxygen flow rate 300 sccm; hydrogen/ nitrogen mixed gas ($H_2$ 3%) flow rate 60 sccm; total pressure 0.55 torr; and RF power of 200 watts. During the etch-back and planarization of this SOG film 25, it can be judged, through use of optical observation and correlation data shown in FIG. 5, whether the etch-back amount is optimum or not.

After the planarization with such etch-back amount control, another interlayer insulating film is deposited and a second wiring layer is formed if necessary.

As described above, correlation data between the etch-back amount and the border position of the coated film and underlying layer between a pair of opposing test patterns, is obtained in advance through a plurality of repetitive measurements. During an actual planarizing process, the border position is optically detected and the optimum etching amount is judged in accordance with the correlation data. Destructive inspection is not necessary and multi-point inspection is easy. Planarization can be performed under a correct etching amount control and with less variation.

Figure 7:
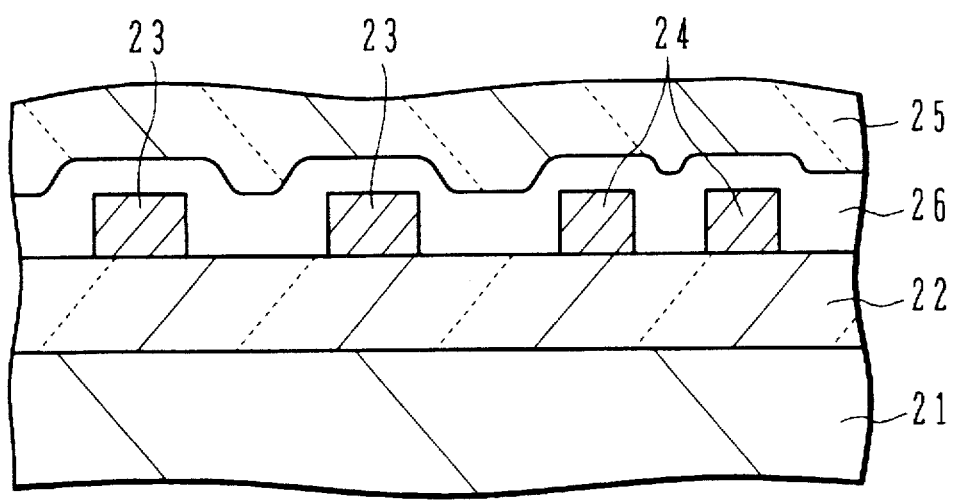
FIG. 7 illustrates a planarizing process according to another embodiment.
Figure 8:
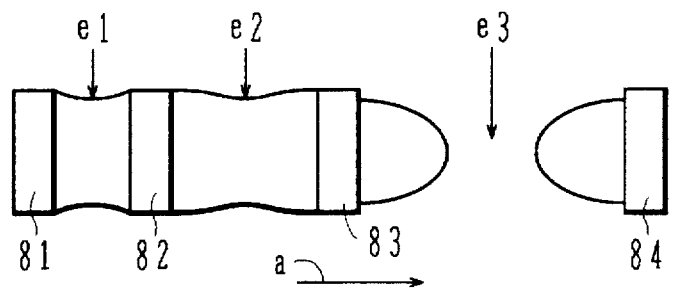
FIGS. 8 to 13 show test patterns in plan view according to other embodiments.

In another embodiment shown in FIG. 7, after a first wiring pattern 23 is formed, an insulating film 26 such as an $SiO_2$ film is deposited through chemical vapor deposition (CVD) and a planarizing SOG film 25 is formed thereon. If the insulating film 26 is a good step coverage film, the shape of the test pattern 24 is transferred to the surface of the insulating film. The CVD film and the SOG film can have different etching rate. Also, the difference in the film property can be reflected to the difference in interference (color). The border or boundary between the CVD film and the SOG film can be detected by the variation in color. Judging an etch-back amount is also possible not by directly using the test patterns 24 but by using the test patterns transferred to the surface of the insulating film 26. In this case, the structure shown in FIG. 7 is used in obtaining the correlation data such as shown in FIG. 5.

Test patterns are not limited only to those described with the above embodiment, but test patterns having various planar shapes such as shown in FIGS. 8 to 13 may also be used. The test pattern shown in FIG. 8 has a plurality of line areas (convex areas) 81, 82, 83, and 84 having the same width and disposed at intervals of a plurality of different space widths, in a direction perpendicular to the line direction. The line/space ratio gradually becomes small along the direction indicated by an arrow a shown in FIG. 8. As a coated film is etched back in the manner like the previously described embodiment, the border positions between the left unetched film and the underlying layer become different at e1, e2, and e3 in accordance with each space width. The correlation data between the etch-back amount and the border position between the left unetched film and underlying layer can therefore be measured.

Figure 9:
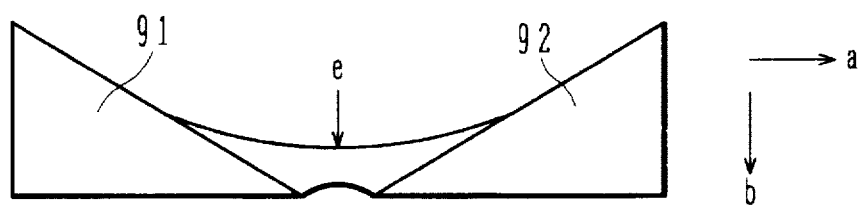

The test pattern shown in FIG. 9 has a pair of convex areas 91 and 92 and an inner space area in a V-character shape successively changing the space width. Similar to the embodiment shown in FIGS. 1A to 1I, the line/space ratio along an arrow a gradually increases along the direction indicated by an arrow b shown in FIG. 9.

Figure 10:
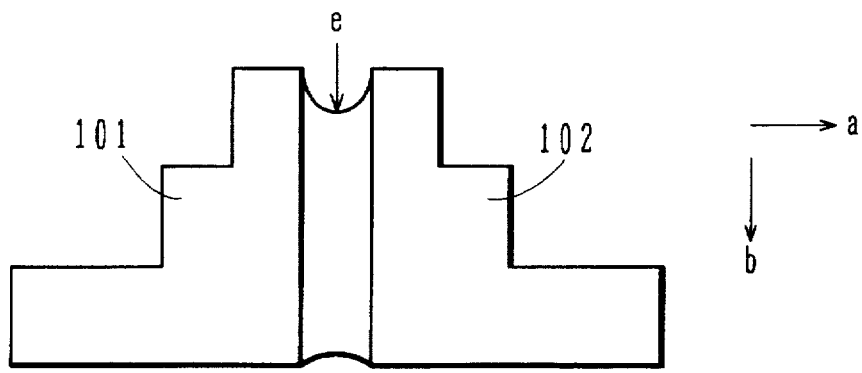

The test pattern shown in FIG. 10 also has a pair of convex portions 101 and 102 separated by a constant gap (space) and having different line widths along the direction of arrow b. The line/space ratio along an arrow a increases as the position is shifted along arrow b. A coated film after etching is thicker as the line area is wider, even if the space width is the same. Namely, the thickness of the coated film becomes different at each different line/space ratio. Therefore, the etch-back amount can be estimated from the border position e while the coated film is etched back.

Figure 11:
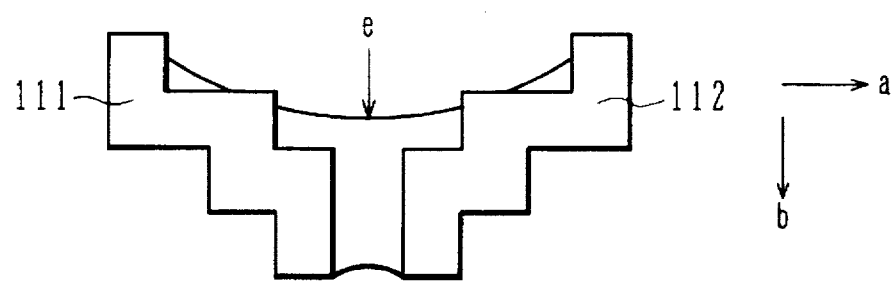

The test pattern shown in FIG. 11 has a pair of convex areas 111 and 112, with the line width and space width being changed in a more complicated manner.

Figure 12:
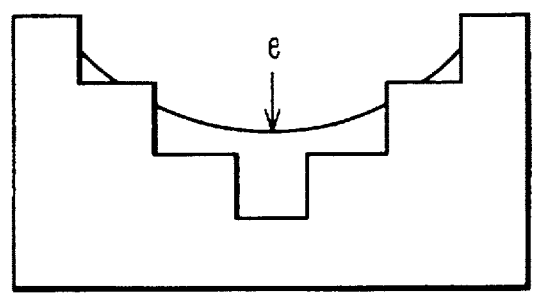
Figure 13:
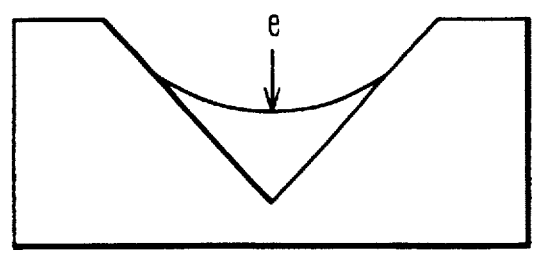

The two convex areas of the above test patterns are not necessarily required to be separated. For example, the test pattern of the embodiment shown in FIGS. 1A to 1I may be integrally formed as a single convex area as shown in FIG. 12, and the test pattern shown in FIG. 9 may be integrally formed as a single convex area as shown in FIG. 13. The line/space ratios of these test patterns are also different at respective space areas, and the correlation data between the etch-back amount and the border position e between the coated film and underlying layer can be measured.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising the steps of:

forming a test pattern on a surface of a semiconductor substrate formed with desired circuit elements, said test pattern having line areas and space areas defined between the line areas having different ratios of a line width to a space width along a first direction at a plurality of positions disposed along a second direction perpendicular to the first direction on the substrate, and the line area having a constant thickness;

forming a coated film over the surface of said semiconductor substrate formed with the test pattern to fill said space areas; and etching-back said coated film, while detecting a border position established at an interface between said coated film filling the space area in said test pattern and an exposed underlying layer which is exposed through the etch-back of said coated film and estimating etching amount from previously measured correlation data between the border position and an etching amount.

2. A method according to claim 1, wherein said step of forming said test pattern forms a wiring pattern at the same time.

3. A method according to claim 2, wherein said test pattern is made of Al or Al alloy.

4. A method according to claim 1, wherein said etching step is performed by dry etching using plasma.

5. A method according to claim 1, further comprising the step of forming a deposited film on said test pattern, prior to said step of forming said coated film.

6. A method according to claim 5, wherein said step of forming said deposited film is performed by chemical vapor deposition.

7. A method according to claim 6, wherein said deposited film is an insulating film.

8. A method according to claim 1, wherein said test pattern has a planar shape having inner opposing sides defining the space areas, the inner opposing sides being shaped in a stepwise profile.

9. A method according to claim 1, wherein said test pattern has a planar shape having inner opposing sides defining the space areas, the inner opposing sides being shaped in a continuously changing profile.

10. A method according to claim 1, wherein said test pattern has a planar shape having inner opposing sides defining the space areas and outer sides defining the line areas together with the inner opposing sides.

11. A method according to claim 10, wherein the outer sides include two parallel sides.

12. A method according to claim 11, wherein the inner opposing sides are shaped in a stepwise profile.

13. A method according to claim 11, wherein the inner opposing sides are shaped in a continuously and monotonically changing profile.

14. A method according to claim 10, wherein the inner opposing sides and the outer sides are both shaped to have a non-linear profile.

15. A method according to claim 14, wherein the inner opposing sides and the outer sides are both shaped in stepwise profile.

16. A method according to claim 10, wherein the inner opposing sides are parallel and the outer sides are shaped to have a non-linear profile.

17. A method according to claim 16, wherein the outer sides are shaped in a stepwise profile.

18. A method according to claim 10, wherein said test pattern is an integral pattern including the inner opposing sides and the outer sides.

19. A method according to claim 1, wherein said test pattern includes more than two rectangular patterns, the rectangular patterns being disposed along one direction, with the space areas having different widths being interposed between adjacent pair of the rectangular patterns.

20. A method of manufacturing a semiconductor device comprising the steps of:

forming a test pattern on a surface of a semiconductor substrate formed with desired circuit elements, said test pattern having line areas and space areas defined between the line areas having different ratios of a line width to a space width along a first direction at a plurality of positions disposed along a second direction perpendicular to the first direction on the substrate, and the line areas having a constant thickness;

forming an insulating film over the surface of said semiconductor substrate formed with the test pattern to fill said space areas;

forming a coated film on said insulating film; and etching-back said coated film, while detecting a border established at an interface between said coated film filling the space area in said test pattern and an exposed insulating film which is exposed through the etch-back of said coated film and estimating etching amount from previously measured correlation data between the border position and an etching amount.

* * * * *

UNITED STATES PATENT AND TRADEMARK OFFICE
CERTIFICATE OF CORRECTION

PATENT NO.   : 5,792,673
DATED        : August 11, 1998
INVENTOR(S)  : Masahiko Nagura It is certified that error appears in the above-indentified patent and that said Letters Patent is hereby corrected as shown below:  On the title page: Item [54] and Column 1, line 3, change "MONITORING OF ECHING" to --MONITORING OF ETCHING --.

Signed and Sealed this

Eighth Day of December, 1998

Attest:

BRUCE LEHMAN

Attesting Officer

Commissioner of Patents and Trademarks